United States Patent [19]

Stanley

[11] 4,414,637

[45] Nov. 8, 1983

[54] ADJUSTABLE CLOCK SYSTEM HAVING A DYNAMICALLY SELECTABLE CLOCK PERIOD

[75] Inventor: Philip E. Stanley, Westboro, Mass.

[73] Assignee: Honeywell Information Systems Inc., Waltham, Mass.

[21] Appl. No.: 224,727

[22] Filed: Jan. 13, 1981

[51] Int. Cl.³ .................. H03K 5/04; H03K 5/159
[52] U.S. Cl. .................. 364/569; 364/900; 328/55; 328/63; 307/595
[58] Field of Search .............. 364/569, 200, 900; 328/55, 56, 58, 60, 63, 66, 72, 74; 307/595, 265, 269, 600, 601–603

[56] References Cited

U.S. PATENT DOCUMENTS

| | | | |
|---|---|---|---|
| 3,624,519 | 11/1971 | Beydler | 328/66 |
| 3,633,113 | 1/1972 | Grubel | 307/602 |
| 4,165,490 | 8/1979 | Howe, Jr. et al. | 328/55 |
| 4,316,148 | 2/1982 | Kaminski | 328/63 |

*Primary Examiner*—Gary Chin

*Attorney, Agent, or Firm*—William A. Linnell; Nicholas Prasinos

[57] ABSTRACT

A clock system for providing rectangular wave forms or wave trains, with each wave train having a selectable predetermined clock cycle period. A rectangular wave train is generated by a generator comprising a first delay line coupled to an inverter by using a multitapped second delay line to delay the rectangular wave train by selectable predetermined period. A control signal is formed which when fed into the generator produces a second rectangular wave train with a clock cycle period equal to the rectangular wave train clock cycle period plus the period of the second selected predetermined delay. By serially connecting a multitapped third delay line in series with the second delay line and by providing a first switch to select one of the outputs from said third delay line, the clock cycle period of the clock system may be adjusted. Use of a multitapped delay line for the first delay line and the addition of a second switch for selection among the various delayed signals of the first delay line, enable selective adjustment of clock pulse width.

5 Claims, 3 Drawing Figures

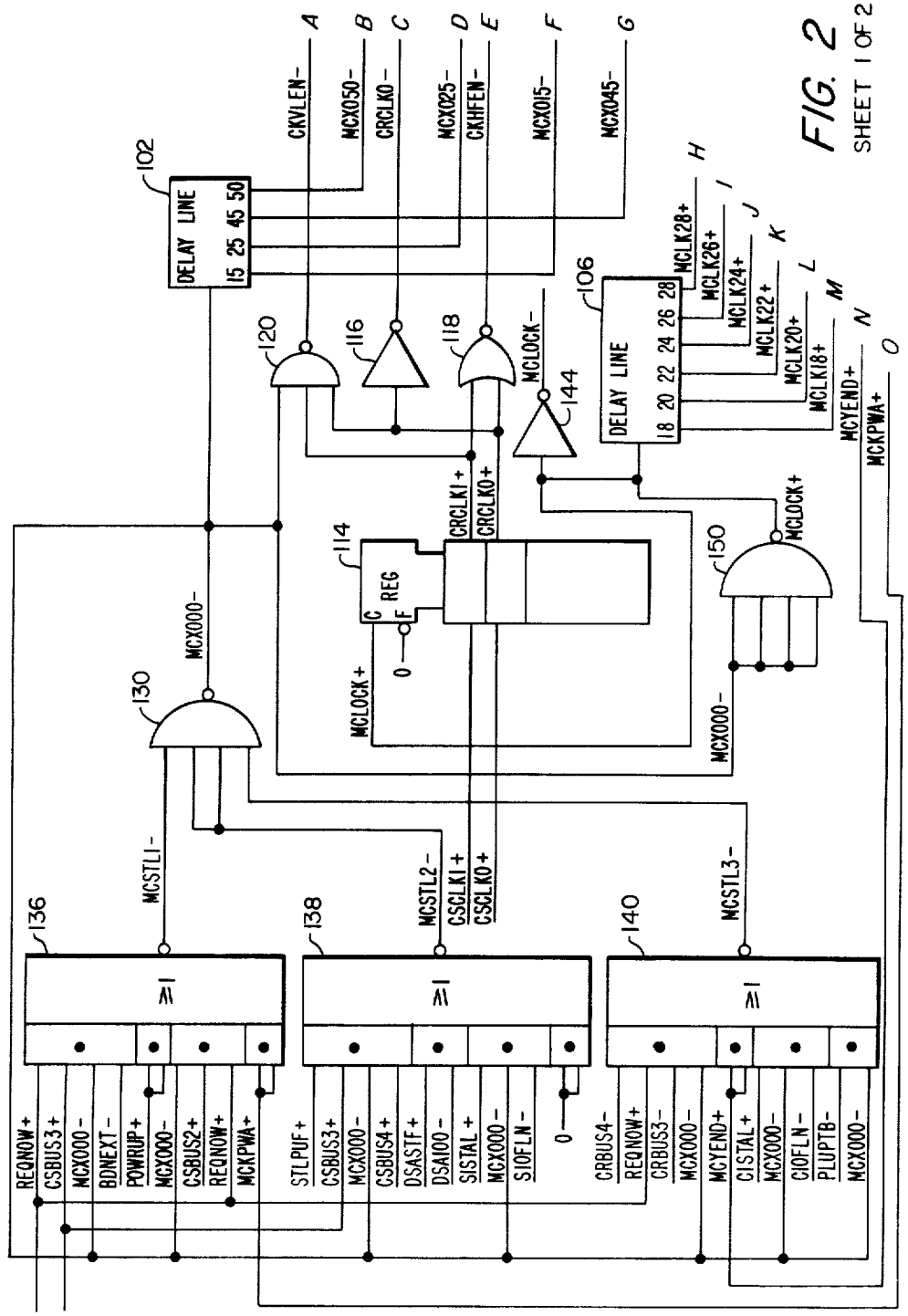
FIG. 2 SHEET 1 OF 2

ADJUSTABLE CLOCK SYSTEM HAVING A DYNAMICALLY SELECTABLE CLOCK PERIOD

BACKGROUND OF THE INVENTION

1. Field of the Invention

The present invention generally relates to data processing systems and more particularly to delay line clock systems utilizing and controlling the transfer of information from such data processing systems.

While the invention has particular application for generating timing signals for data processing systems and will be described hereinafter for such use, it is to be understood that the present invention may be utilized to generate timing signals for timing the operation of other devices.

2. Description of the Prior Art

In data processing systems, the transfer of information is particularly controlled by clock pulses derived from clock cycles generated by a clock system. In a typical clock system, the clock generates a rectangular wave train signal, with the signal being in a high state for a portion of the clock cycle and the signal being in a low state for the remainder of the clock cycle. In this type of clock system, the change of the clock signal from the high to the low state or from the low to high state is used to trigger various circuits within the data processing system, including the latching of registers and the clocking of flip-flops. In addition, the high or low state of the clock signal may be used to enable various gates within the data processing system. The period of the clock cycle of a data processing system is usually chosen to match the speed of the logic circuits used in a central processing unit (CPU). Since data processing system timing and control are directly dependent on the clock system signal, the clock signal must be highly reliable and stable.

In microprogrammed data processing systems, the execution time of the various microoperations will usually vary in accordance with the complexity of the microoperation performed. The more complex operations usually require more time to allow the signals to propagate through the increased number of logic gates involved. To maximize performance of a microprogrammed data processing system, it is desirable to have a clock cycle period available that matches the time required by each distinct microoperation. Although this matching could be accomplished by having multiple clock systems, it is much more desirable, because of circuit component expense and synchronization problems, to have one system from which a variety of predetermined clock cycle periods can be dynamically selected. The selection process should be such that after the microinstruction is read from the microprogram control store, and the particular microoperations to be performed by the microinstruction are determined, the clock cycle period can be adjusted to permit sufficient time, but not excessive time, to complete the particular microoperations in the process of being executed. The clock cycle period can be implicitly selected by being associated with the microoperations of the microinstruction with the microoperation decoder providing one or more bits used to select the clock cycle period. In a data processing system that does not overlap the execution of microinstructions, e.g., the next microinstruction being read during the execution of the current microinstruction, it is important that the clock cycle period selection and generation be done within the selected clock cycle period. The speed matching is done so that the clock cycle is sufficiently long to allow data signals the opportunity to propagate through the longest logic path.

In any clock system, particularly when used in a data processing system, the stability of the clock cycle period is important. That is, it is desirable that the clock cycle period vary as little as possible due to variation in component operating temperature, operating voltage, or the particular component used in fabrication of a particular clock system. Each component used in fabricating a clock system has its own propagation time tolerances. Because the summation of the individual propagation time tolerances of each component used in a path of a clock system circuit is used to determine the worst case timing of a clock system, it follows that reducing the number of components in each path will lead to increased clock stability. Stability can also be increased by choosing components which inherently have narrower tolerances than other components. For example, it may be desirable in a clock system circuit to use a delay line which has a typical propagation time tolerance of plus or minus 5% due to voltage and temperature variations rather than multivibrators or one shots which have looser typical propagation time tolerances.

A clock system in a data processing system is generally inhibited from generating clock pulses when information is not to be strobed into a receiving element, so as to prevent the transfer of erroneous information or loss of information thereby creating an error condition. Accordingly, a stall signal or condition is generated. A typical example of a stall condition may be, for example, that condition under which a utilizing element such as a CPU is waiting for the data processing system's memory to provide information thereto. When the receiving element is expecting the information from the memory, a clock pulse is not generated for strobing the information to the receiving element, particularly if there is an indication that the memory will not be providing such information for possibly another clock cycle. Accordingly, a stall condition is generated that will stall the clock by preventing the clock's rectangular wave train signal from changing state, thereby stalling the generation of further clock pulses. By providing a stall high signal that stalls the clock's rectangular wave train signal in the high state, the high to low clock pulse can be inhibited. By providing a stall low signal that stalls the clock's rectangular wave train signal in the low state, the low to high clock pulse can be inhibited. These stall conditions however, upon an indication that the information will be presently transferred, will be cleared so as to generate another clock cycle and the pulses derived therefrom. It is important in such clock systems that the clock cycle be able to start up again in a minimum period of time after the removal of the stall condition. An example of a stallable clock system is given in U.S. Pat. No. 4,134,073 entitled "Clock System Having Adaptive Synchronization Feature" issued to William W. MacGregor and incorporated herein by reference.

By minimizing the number of components and by using components with inherently narrower tolerances in the clock system circuit, manufacturing economy can be achieved and a need to individually tune each clock system to the specified clock period can be eliminated. An example of a stallable clock having dynamically selectable clock periods which utilizes a minimum number of narrower tolerance components is given in U.S. Pat. No. 4,241,418 entitled "Clock System Having a Dynamically Selectable Clock Period" issued to Philip E. Stanley and incorporated herein by reference.

As performance of data processing systems is improved by use of faster circuit components in the logic circuits, the clock cycle periods used in the CPU become shorter and accumulative tolerance that must be allowed due to component variations in the clock system circuit becomes a larger percentage of the total clock cycle period. For example, the variation may be plus or minus 5 nanoseconds in a 100 nanosecond clock cycle period for a data processing system designed for a minimum 95 nanosecond clock cycle period results in a plus or minus 5% variation in the clock cycle period. The same plus or minus 5 nanosecond variation in a 50 nanosecond clock cycle period results in a plus or minus 10% variation in the clock cycle period in a system designed for a minimum 45 nanosecond clock cycle period. If the clock can be adjusted during manufacturing to have a 45 nanosecond clock cycle period with a tolerance of −0 nanoseconds and +2 nanoseconds, the throughput of the worst case data processing system with an adjustable clock cycle period, one having a clock cycle period of 47 nanoseconds (45+2), can be up to 17.7% ((55−47)/45*100) better than a data processing system having a non-adjustable clock with the worst case clock cycle period of 55 nanoseconds (50+5).

Therefore, although it is desirable as mentioned hereinbefore not to have to individually adjust the clock cycle period of the system clock during manufacture, adjustment is necessary in order to maximize the throughput of the data processing system. An example of the clock system providing for the adjustment of the clock frequency is given in U.S. Pat. No. 3,775,696 entitled "Synchronous Digital System Having a Multi-Speed Logic Clock Oscillator" issued to Emory Carl Grath and incorporated herein by reference. In the clock system of U.S. Pat. No. 3,775,696, an adjustable delay line is connected in series with a fixed delay line with the output of the delay lines being fed as input to a NAND gate and the output of a NAND gate being fed as input to the delay lines as well as being used for the clock signal. In this device, the adjustable delay line is comprised of a plurality of selected lengths of copper transmission line which are etched onto any epoxy-glass circuit board onto which the remaining components are mounted, with each transmission line connecting a pair of plated terminals which extend through the printed circuit board. The propagation delay of copper etch on epoxy-glass circuit boards is approximately six inches per nanosecond, such that each foot of transmission line introduces a two nanosecond time delay. The transmission line lengths are adaptable to be selectively interconnected by connecting the appropriate terminals, thereby introducing accumulative time delays. The lengths of the transmission line segment are binary weighted to allow introduction of a desired time delay with a minimum number of interconnections. The plurality of plated holes at the ends of the lengths of copper transmission line which comprise the adjustable delay line may be interconnected by short wire jumpers while only introducing negligible time delays.

Although the clock system of U.S. Pat. No. 3,775,696 is adjustable, it has several disadvantages. To provide for an adjustment of plus or minus 12 nanoseconds, a span of 24 nanoseconds, a minimum of 12 feet of copper etch transmission line is required and providing this may present significant problems in laying out the circuit board as more and more complex, circuits requiring more interconnects are used. In addition, the adjustment of the clock during manufacture by the placing of jumpers can be time consuming and therefore costly. Further the clock system can not be easily adjusted in the field during system maintenance to compensate for changes in clock speed due to components aging or replacement. Also the clock system can not be easily adjusted to operate the data processing system at marginal speeds to detect speed dependent problems before they impair the data processing system performance at normal operating speed.

OBJECTS OF THE INVENTION

It is a primary object of the invention therefore to provide an improved means for adjusting the clock cycle period of a clock system.

It is also an object of the invention to provide an improved means for providing a plurality of selectable clock cycle periods.

It is another object of the invention to be able to dynamically select the period of the clock cycle, after the clock cycle has started.

It is still a further object of the invention to provide a stable clock cycle whose period does not vary unduly with component operating temperature, operating voltage, or choice of the particular components used in the manufacture of the clock system.

It is yet another object of the invention to provide a clock system with a minimum number of components in the circuit path used to generate the shortest clock cycle period.

It is another object of the invention to provide a clock system which is adaptive in design to provide synchronization or start up of a clock cycle in a minimum period of time after the removal of a stall signal.

SUMMARY OF THE INVENTION

In accordance with the above and other objectives of the invention, a multitapped second delay line which has multiple associated delay periods is utilized to generate a control signal having a first state and a second state which is fed back to a controllable rectangular wave train generator comprising a first delay line and an inverter. The second delay line is utilized to receive and delay a rectangular wave train produced by the rectangular wave train generator. The rectangular wave train is comprised of a series of clock cycles composed of a first portion having a first state and a second portion having a second state. A logic circuit is provided which receives the multiple delayed rectangular wave train signals from the second delay line and forms the control signal.

The rectangular wave train generator responds to the first state of the control signal by inhibiting generation of the second portion of a clock cycle thereby extending the duration of the preceding first portion of the clock cycle. The rectangular wave train generator responds to the second state of the control signal by enabling generation of the second portion of a clock cycle which has a normal duration.

The logic circuit is responsive to cycle sheet signals which determine which of the multiple delayed rectangular wave train signals will be used to form the control signal, thus permitting the selection of the clock cycle period from a set of predetermined clock cycle periods. The logic circuit allows the cycle select signals to be changed during the generation of a clock cycle positive pulse thereby permitting the generation of a rectangular wave train with each clock cycle period being dynamically selected after the generation of the clock cycle has started. This dynamic selection capability permits the clock system to generate a rectangular wave train with each clock cycle period being a predetermined period but independent of the period of the preceding or succeeding clock cycle.

The rectangular wave train generator includes gate logic which is responsive to a stall signal having a first state and a second state. This gate logic responds to the first state of the stall signal by inhibiting the rectangular wave train generator from producing the second state of a clock cycle and responsive to the second state of the stall signal by enabling the rectangular wave train generator to resume generation of the clock cycle in an adaptive manner with only a minimal delay. By serially connecting a multitapped third delay line in series with the second delay line and by providing a first switch to select one of the outputs from said third delay line, the clock cycle period of the clock system may be adjusted. Use of a multitapped delay line for the first delay line and the addition of a second switch for selection among the various delayed signals of the first delay line, enable selective adjustment of clock pulse width.

This invention is pointed out with particularity in the appended claims. An understanding of the above and further objects and advantages of this invention may be obtained by referring to the following description taken in conjunction with the drawings.

BRIEF DESCRIPTION OF THE DRAWINGS

The manner in which the apparatus of the present invention is constructed and its mode of operation can best be understood in light of the following detailed description together with the accompanying drawings in which like reference numerals identify like elements in the several figures and in which.

DESCRIPTION OF THE PREFERRED EMBODIMENT

The clock system of the instant invention produces a fixed width clock pulse with a number of dynamically selectable intervals between clock pulses. In the preferred embodiment, the clock system is used in the CPU of a data processing system having four selectable intervals between clock pulses which are controlled by the CPU firmware. In addition, the clock has the ability to stall for an indefinite period under the control of external events.

Figure 1:
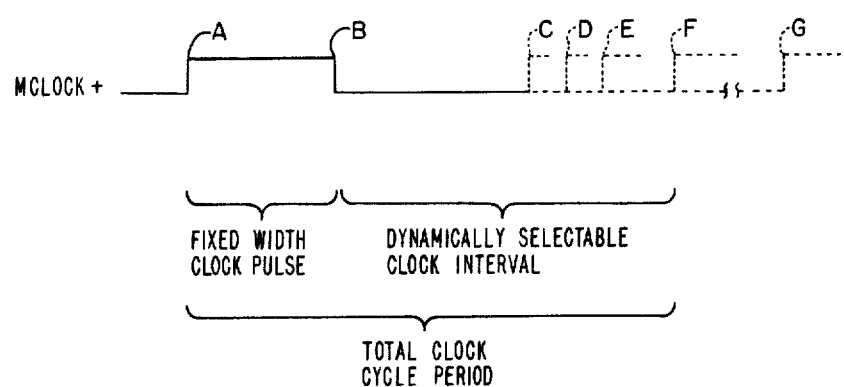
FIG. 1 is a diagram of a segment of a clock system generated rectangular wave train showing one complete clock cycle comprises of a fixed width pulse followed by a dynamically selectable clock interval.

Referring to FIG. 1, it can be seen that the total clock cycle period of clock system signal MCLOCK+ is composed of a fixed width positive clock pulse from time A to time B followed by a dynamically selectable interval from B to C, D, E, or F during which time the clock signal MCLOCK+ is in the low state. The length of time during which the clock signal MCLOCK+ is in the low state is dependent upon whether the very-fast (from B to C), the half-fast (from B to D), the half-long (from B to E), or the very-long (from B to F) interval has been selected. The clock will stay stalled in the low state from time C, D, E or F when it would normally return to the high state until time G if the clock is stalled by some external event. As will be seen hereinafter, the widths of the positive clock pulse from A to B is adjustable to finely tune the clock as is the very-fast interval from time B to time C, the length of the other intervals from B to D, B to E, and B to F being affected by the adjustment of the interval from B to C. Thus in the preferred embodiment, the lengths of time that the clock signal is in the high state is adjustable and the lengths of time that the clock signal is in the low state is adjustable with both adjustments affecting the total clock cycle period.

Figure 2:
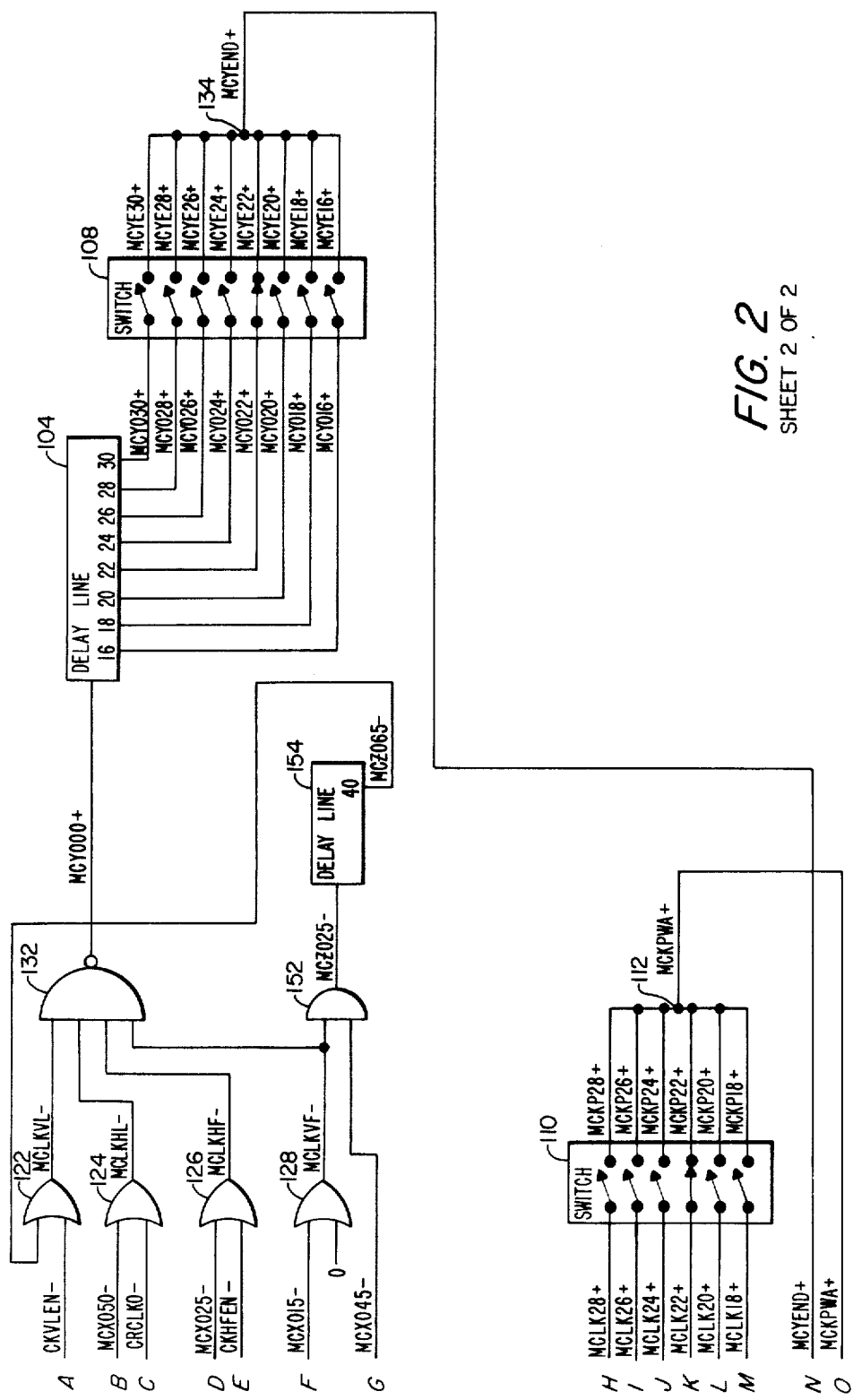
FIG. 2 is a logic diagram of a preferred embodiment of the clock system of the present invention.

In the preferred embodiment, the basic timing elements of the clock are 3 delay lines and a number of gates which control various signals in association with them. The logic of the clock is shown in FIG. 2. The logic shown in FIG. 2 with the exception of gates 136, 138 and 140 is that portion of the clock system which is concerned with the basic clock frequency; that is, the clock pulse intervals in the absence of external stall events. It can be seen to consist of 3 delay lines: delay line 102, a 50 nanosecond delay line in the preferred embodiment; delay line 104, a 30 nanosecond delay line in the preferred embodiment; and delay line 106, a second 30 nanosecond delay line in the preferred embodiment. In the preferred embodiment, delay lines 102, 104 and 106 are of the types L21-199 and L22-112 manufactured by RCL Electronics Division of AMF Inc. of Manchester, N.H. Delay line 102, having input signal MCX000−, is the first of the two delay lines which control the clock interval (from time B to C, D, E or F in FIG. 1). One or more of the outputs of the delay line 102 are selected as input into the delay line 104 in order to provide a particular control interval for a given firmware step. Delay line 104, having input signal MCY000+, is the other delay line concerned with controlling the clock interval. Its presence in this system is largely to allow fine switch selection of the exact clock frequency by adjusting the very-fast clock interval from time B to C in FIG. 1. In systems sensitive to clock speed and performance, it was necessary to be able to adjust the clock to an exact specified value in each system in a simple fashion. This delay line 104 and the switch 108 are used to accomplish this. Delay line 106, whose input is the signal MCLOCK+, is the delay line which is used to control the positive clock pulse width (from time A to B in FIG. 1). In the preferred embodiment, the clock generates a series of positive 35 nanosecond pulses and the clock frequency, which will be referred to later on in this discussion, really refers to the variable control interval between successive positive clock pulses.

Clock pulse width (from time A to B in FIG. 1) adjustment is accomplished by switch 110 which selects one of the outputs of the delay line 106 to generate a pulse width controlling signal at the output of the wired OR 112. The logic at the top of FIG. 2 is concerned primarily with the selection of the various clock intervals. That is, in the preferred embodiment the approximate period between the low-to-high transitions of successive positive pulses in the clock can be 88, 98, 123, or 161 nanoseconds (from time A to C, D, E or F respectively in FIG. 1). Which of these 4 clock periods is produced is controlled by two firmware bits associated with each CPU control store word, thus each firmware step controls its own clock interval and therefore total clock cycle period.

These two firmware bits are control store bits, signals CSCLK1+ and CSCLK0+, which are shown entering register 114. Signals CSCLK1+ and CSCLK0+ are latched in register 114 at the beginning of each firmware step by clocking signal MCLOCK+ at the register's clock (C) input because the register is always enabled by the binary ZERO at the enable (F) input. The outputs of register 114, signals CRCLK1+ and CRCLK0+, are the signals which control the clock frequency in the current firmware step. If both signals CRCLK0+ and CRCLK1+ are low (a binary ZERO), the the interval between clock pulses is specified to be at least 88 nanoseconds (referred to as very-fast). If the signal CRCLK1+ is high, a binary ONE, and signal CRCLK0+ is a binary ZERO, then the current firmware step is specified to have a clock frequency period of 98 nanoseconds (referred to as half-fast). If signal CRCLK0+ is a binary ONE and signal CRCLK1+ is a binary ZERO, then the current firmware step is specified to have a clock period of 123 nanoseconds (referred to as half-long). Finally, if both signals are binary ONE's, then the current firmware step is to have a clock period of 161 nanoseconds (referred to as very-long). These signals coming out of register 114 pass through inverter 116, NOR gate 118, or NAND gate 120 and their outputs enable the three OR gates 124, 126 and 122 respectively. These three OR gates 122, 124 and 126 together with OR gate 128 represent the 4 paths of clock delaying pulse in the main clock path.

The selectable clock path consists of the NAND 130 which generates the signal MCX000—, the delay line 102 whose outputs are gathered through OR gates 122, 124, 126, and 128, and the outputs of these gates are in turn collected by driver 132 which generates a signal MCY000+. Signal MYC000+ in turn is the input to the delay line 104. One of the outputs of delay line 104 is switch-selected during board adjustment in manufacturing to become the signal MCYEND+ from wired OR 134. Signal MCYEND+ goes through the stall logic of gates 136, 138, and 140 and reappears as a controlling signal at the input to NAND gate 130. Specifically, it reappears as signal MCSTL1— as an input to gate 130. That is the closed path which controls the CPU clock interval.

The logic shown on the left-hand side of FIG. 2 consisting of gates 136, 138, and 140 is concerned with collecting all the possible stall and feedback terms and inputting them into the clock again. In this type of clock system, a signal passes through a delay line, is inverted, and becomes a feedback term to shut itself off, going back into the delay line again. The primary collectors of the stall and feedback terms are the three AND-OR-INVERT gates 136, 138 and 140 whose outputs are respectively the signals MCSTL1—, MCSTL2— and MCSTL3—. In the preferred embodiment, AND-OR-INVERT gates 136, 138, and 140 are the type SN74S64 manufactured by Texas Instruments Incorporated of Dallas, Tex. and described in their publication entitled "The TTL Data Book for Design Engineers," Second Edition, which is incorporated herein by reference.

Two of the input gate sections to these three stall collecting gates 136, 138 and 140 are of particular importance in terms of controlling the basic clock frequencies. The first of these is the fourth AND gate section of gate 136 which generates the signal MCSTL1—, both of whose inputs are the signal MCKPWA+. This two input AND gate section of gate 136 is the path by which the pulse width control signal feeds back to the beginning of the clock. The other two input AND gate section of interest is the second AND gate section of gate 140 which generates the signal MCSTL3—, both of whose inputs are signal MCYEND+. This two input AND gate section of gate 140 is the path by which the clock period control term (signal) reenters the clock at the beginning of the delay line. All other input AND gate sections of gates 136, 138 and 140 (the other 3 AND gate section of gate 136, all 4 AND gate sections of gate 138, and the other 3 AND gate sections of gate 140) are for admitting various stall terms.

A stall term is basically a signal which prevents the clock pulse from occurring at the end of its normal period. If a stall has been called for by some firmware controlled or hardware controlled condition, then at the end of the clock period, when it would be normally expected that the next 35 nanosecond positive pulse would begin, one of these gates would be conducting a signal which would hold off the positive clock pulse until the hardware condition which causes the stall finally relaxes. The functioning of these external stall terms will be discussed later after the functioning of the clock in the absence of stalls has been discussed. The signals output by gates 136, 138 and 140 are input to NAND gate 130. There are other NAND gates (not shown in FIG. 2) having the same input signals as NAND gate 130 which are used to generate powered parallel signal versions of signal MCX000— and these parallel signals are distributed throughout the data processing system. The output of NAND gate 130, signal MCX000—, is inverted by NAND gate 150 to produce signal MCLOCK+ which is in turn inverted by inverter 144 to produce signal MCLOCK—. There are other inverters (not shown in FIG. 2) which have the same input signals as NAND gate 150 and inverter 144 which generate powered parallel signal version of signals MCLOCK+ and MCLOCK— and these parallel signals are distributed throughout the data processing system. These three signals, MCX000—, MCLOCK+, and MCLOCK—, are the basic timing signals that are used throughout the CPU to control various functions by clocking flip-flops and registers, and to otherwise enable gates.

Figure 3:
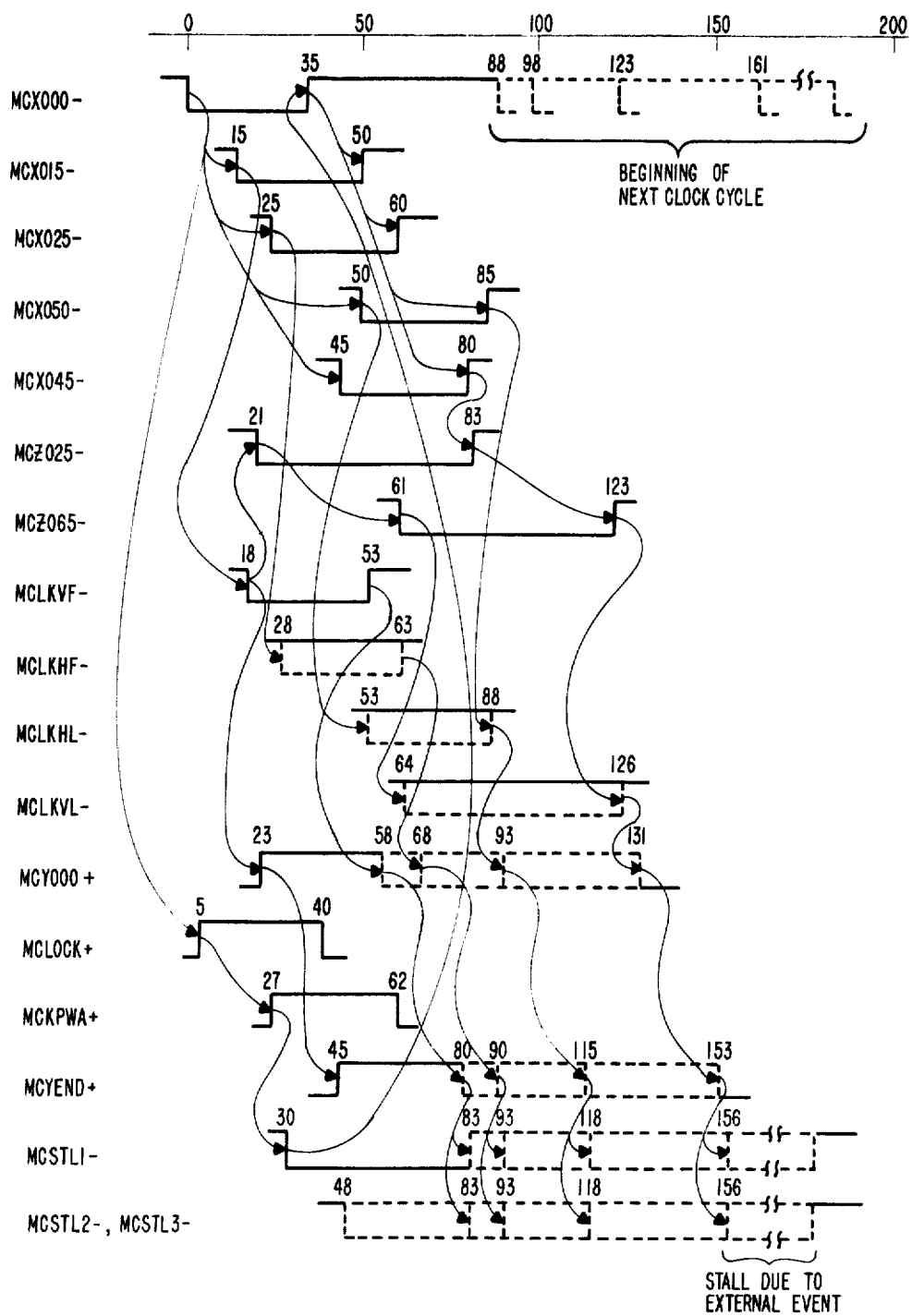
FIG. 3 is a diagram showing the timing relationship of the various signals produced by the clock system of FIG. 2.

In the absence of external stalls, the flow of timing edges through the clock is as follows. Referring now to FIG. 3, the fundamental timing edge (the negative-going edge of signal MCX000— at time O in FIG. 3), the one which propagates throughout the clock system and is the one most easy to trace, is the edge produced when all of the inputs to the NAND gate 130 go high (a binary ONE). At that point the output of gate 130 goes low (a binary ZERO). This time is time zero in FIG. 3. At appropriate times thereafter, the outputs at the various taps of delay line 102 go low. These outputs are the 15 nanosecond tap producing signal MCX015—, the 25 nanosecond tap producing signal MCX025—, the 45 nanosecond tap producing signal MCX045—, and the 50 nanosecond tap producing signal MCX050—. The other taps (not shown in FIG. 2) from delay line 102 are not used. At the same time that the output of gate 130, signal MCX000—, goes low (a binary ZERO), so does the output of all the other parallel NAND gates having the same inputs (not shown in FIG. 2). Thus one gate delay later, NAND gate 150, which is a 4 input line driver, has all its outputs go low, therefore the output of gate 150, signal MCLOCK+, goes high (a binary ONE). Some number of nanoseconds later, the signal MCKPWA+ from wired OR 112 goes high. The precise number of nanoseconds is controlled by which of the 6 switches in the switch assembly 110 is closed. The setup of switch assembly 110 for this particular adjustment is that one of those 6 switches is closed and the other 5 are open. Which one is closed is selected at assembly time when the printed circuit board containing the clock system is tested and the selection of this switch closure is what adjusts the clock pulse width (from time A to B in FIG. 1). For the sake of this discussion (as illustrated in FIG. 2), it will be assumed that the 22 nanosecond tap on the delay line 106 which outputs signal MCLK22+ is the signal which is enabled by switch assembly 110 to wired OR 112 to produce signal MCKPWA+. The other 5 switches of switch assembly 110 are open. Thus if you assume that, for the sake of discussion, that the propagation time through a line driver such as NAND gate 150, which in the preferred embodiment is a type SN74S140 circuit manufactured by Texas Instruments Inc. of Dallas, Tex., and described in their hereinbefore referenced publication is approximately 5 nanoseconds, and through an ordinary gate is about 3 nanoseconds, then at 27 nanoseconds after the primary timing event, the fall of MCX000−, the positive-going edge of signal MCKPWA+ will go high. The moment that that positive-going edge of signal MCKPWA+ goes high, then both inputs to the fourth AND function in gate 136 become a binary ONE. Therefore, at time 30 nanoseconds signal MCSTL1− at the output of gate 136 goes low (a binary ZERO). This in turn as an input to NAND gate 130 turns off gate 130, driving its output signal MCX000− high (a binary ONE) at time 35 nanoseconds. Thus signal MCX000− is generated to have a 35 nanosecond negative-going pulse which is traveling down the delay line 102 driven by gate 130. Thus the edge of signal MCX015− that went low at 15 nanoseconds tap of the delay line 102 goes high again at 50 nanoseconds. The signal MCX025− that goes low at 25 nanoseconds will go high again at 60 nanoseconds, and the signal MCX045− that goes low at 45 nanoseconds goes high again at 80 nanoseconds, and the signal MCX050− that goes low at 50 nanoseconds goes high at 85 nanoseconds.

The signal MCX015− coming out of delay line 102 goes through a non-inverting OR gate 128 becoming the signal MCLKVF−. Signal MCLKVF− is one of the two inputs to AND gate 152 which generates the signal MCZ025−. The output of AND gate 152 will be a binary ZERO (low) whenever either of the inputs is a binary ZERO. Therefore, signal MCZ025− will go low 3 nanoseconds after signal MCLKVF− goes low. Signal MCLKVF− goes low at 18 nanoseconds; therefore the output of gate 152, signal MCZ025−, goes low at 21 nanoseconds. The other input to gate 152 is the signal MCX045−. Signal MCX045−, output by delay line 102, goes low at 45 nanoseconds and high at 80 nanoseconds. Therefore, of the two inputs to gate 152, signal MCLKVF− goes low at 18 nanoseconds and high at 53 nanoseconds and signal MCX045− goes low at 45 nanoseconds and high at 80 nanoseconds. These signals overlap, therefore the output of gate 152, signal MCZ025−, will appear to be one long negative pulse going low at 21 nanoseconds and high at 83 nanoseconds. Signal MCZ025− is then passed through a 40 nanosecond delay line 154, emerging as signal MCZ065− which is a negative pulse which goes low at 61 nanoseconds and high at 123 nanoseconds.

The four signals, MCX015−, MCX025−, MCX050−, and MCZ065−, are the four timing signals which are enabled through the OR gates 128, 126, 124 and 122 respectively. If this firmware step is considered to be the shortest, a so-called very-fast firmware step with a clock cycle period of 88 nanoseconds, then only the OR gate 128 will transmit its timing signal and only that one input to NAND gate 132 will be active (controlling) with the other three inputs being binary ONE's. Thus the signal MCY000+ will go high (a binary ONE) at 23 nanoseconds and low (a binary ZERO) at 58 nanoseconds. If this firmware step is a half-fast period step, that is, it has CRCLK1+ a binary ONE and CRCLK0+ a binary ZERO, then the output of NOR gate 118, signal CKHFEN−, will be a binary ZERO and enable the output of gate 128 to be controlled by signal MCX025−. Signal MCLKVF− coming out of gate 128 will be the same as before, signal MCLKHF− coming out of gate 126 will be a negative-going pulse that goes low at 28 nanoseconds and high at 63 nanoseconds. Therefore, if the half-fast clock cycle period is selected, the output of the NAND gate driver 132, signal MCY000+, will be a positive pulse which goes high at 23 nanoseconds and low at 68 nanoseconds. If the firmware step is what is referred to as a half-long firmware step, one with a clock period of 123 nanoseconds, which is selected by signal CRCLK1+ being a binary ZERO and CRCLK0+ being a binary ONE, then gates 124, 126, and 128 will be enabled with the output of OR gate 124, signal MCLKHL−, going low at 53 nanoseconds and high at 88 nanoseconds. The collected OR of these three negative pulses, signals MCLKVF−, MCLKHF−, and MCLKHL−, will produce a positive pulse in signal MCY000+ which goes high at 23 nanoseconds and low at 93 nanoseconds. Finally, if the firmware step is selected to be very-long, selected by both signals CRCLK1+ and CRCLK0+ being binary ONE's, then all four of gates 122, 124, 126 and 128 will be enabled. All four negative-going pulses which are collected in NAND gate 132 will result in a positive pulse in signal MCY000+ that goes high at 23 nanoseconds and low at 131 nanoseconds.

The output of NAND gate 132 is the signal which drives the delay line 104, which controls the cycle length, the total clock cycle period for each firmware step. The positive pulse which appears in signal MCY000+ is delayed by delay line 104 for some number of nanoseconds depending upon the particular switch selection made in the switch assembly 108, one of whose switch connections will be closed and the other 7 of which will be open. Thus the delay between signals MCY000+ and MCYEND+ from wired OR 134 is a function of which switch selection has been made. it can be as short as 16 nanoseconds if signal MCY016+ is selected or as large as +nanoseconds if signal MCY030+ is selected from multi-tapped delay line 104. For the sake of this discussion, it is assumed that at 22 nanoseconds signal MCY022+ was selected as shown in FIG. 2. This 22 nanosecond selected by switch assembly 108 is independent of the 22 nanosecond selected in switch assembly 110 and was picked as a typical value for discussion purposes. The precise switch selecting of switch assembly 108 will be set at assembly and test time when the printed circuit board containing the clock system is adjusted so that the total clock cycle period is exactly according to specification.

This adjustment consists of setting the appropriate switch in switch assembly 108.

Returning for a moment to FIG. 1, as discussed hereinbefore switch assembly 110 controls the timing of the negative-going edge at time B and switch assembly 108 controls the timing of the positive-going edge at the end of the total clock cycle period of the very-fast cycle which occurs at time C. Switch assembly 108 also controls the timing of the positive-going edge at times D, E and F because they are a fixed relative to time C. During manufacture in the factory or during maintenance in the field, the clock system is adjusted by first measuring the positive pulse width and adjusting it by closing one switch and opening all others in switch assembly 110. After the pulse width has been adjusted to the desired time value, the total clock cycle period is adjusted by closing one switch and opening all others in switch assembly 108. The adjustments are done in this order because an adjustment in the pulse width by switch assembly 110 will affect the total clock cycle period whereas adjustment of the total clock cycle period by switch assembly 108 does not affect the pulse width.

Returning now to FIGS. 2 and 3, it will be assumed that there is a 22 nanosecond delay between signals MCYOOO+ and MCYEND+. Therefore signal MCYEND+ will consist of a positive pulse whose leading edge goes high at 45 nanoseconds and whose trailing edge goes low at either 80, 90, 115, or 153 nanoseconds, depending upon the particular clock speed selected for this firmware step: very-fast, half-fast, half-long, or very-long.

The signal MCYEND+ is an input to one of the stall gates. Specifically, the second AND gate function of AND-OR-INVERT gate 140 is the signal MCYEND+. As long as that pulse is high, the signal MCSTL3− will be low and since that is an input to the NAND gate 130 this will hold the output of gate 130, signal MXCOOO−, high. Thus in the absence of external stalls, two signals will control the basic clock pulse width and cycle period. The first of these is MCSTL1−, which is a negative-going pulse that goes low at 30 nanoseconds and high at 83 nanoseconds. The second is a negative-going pulse on the signal line MCSTL3− which goes low at 48 nanoseconds and high at either 83, 93, 118 or 156 nanoseconds. The first of these, the negative-going edge of signal MCSTL1−, controls the pulse width (from time A to B in FIG. 1). The positive-going edge of signal MCSTL3−, the edge that goes up at either 83, 93, 118 or 156 nanoseconds, is the edge which controls the beginning of the next clock cycle (from time A to C, D, E or F in FIG. 1). Both of these signals must be high for the next clock pulse to begin. MCSTL1− goes low, turning off the current clock pulse and before it can go back high again, MCSTL3− goes low; then MCSTL1− goes high and finally when ready to begin the next firmware step, MCSTL3− goes high. At that point when all the inputs to NAND gate 130 are a binary ONE, its output goes low (a binary ZERO), and the next clock pulse train is initiated, traveling through the system.

To have a clean clock signal, gates 152 and 118 and delay line 154 are necessary in order to assure that the negative pulses emerging from the gates 122, 124, 126 and 128 overlap. That is, if at any time one negative pulse went high before any other edge from a negative pulse went low to pick up the stalling function, this would create a sliver in the signal MCYOOO+ which would then travel through the delay lines and cause the clock to run in an irrational fashion. Since the two negative pulses, MCLKVF− and MCLKHF−, are so close together in time, this is not a problem between these two pulses. That is, in the case of signals MCLKVF− and MCLKHF−, one starts 25 nanoseconds before the other ends. However in the case of the half-long clock cycle, the signal MCLKVF− goes high at 53 nanoseconds and signal MCLKHL− goes low at 53 nanoseconds thus presenting the possibility of little or no overlap which would result in a sliver in signal MCYOOO+. To eliminate this possibility of a sliver in signal MCYOOO+ when the half-long clock cycle is selected, gate 126 is also enabled by signal CKHFEN− being a binary ZERO which will allow the negative pulse of signal MCLKHF− to mask out any sliver because it stays low for 10 nanoseconds after signal MCLKVF− goes high and signal MCLKHL− goes low providing for a minimum of 10 nanoseconds of overlap.

If the pulse coming out of signal MCLKVL− was only a 35 nanosecond pulse, as the others are, then in order for its trailing edge to be at the appropriate time, that is, 126 nanoseconds, its leading edge will only be 35 nanoseconds ahead of that, which would be 91 nanoseconds. Since the signal MCLKHL− ends at 88 nanoseconds, this guarantees that in typical situations you'll have at least 3 nanoseconds of non-overlap. Therefore it is necessary to create a stretched pulse, one whose trailing edge is at the appropriate time for controlling the very-long clock period, but whose leading edge is forced to be enough sooner so that it will overlap the negative pulse of signal MCLKHL− which in turn will overlap the negative pulse of signal MCLKVF− which in turn overlaps the negative pulse of signal MCLKVF−. This is done in AND gate 152 and delay line 154. AND gate 152 creates the wider pulse and delay line 154 displaces it to the appropriate time point in the clock cycle.

The area of the clock which remains to be discussed is that concerned with external stalls. External stalls are events which can cause the clock to not proceed even though the other inputs to these stall gates have relaxed. The terms that control stalls are all collected along with the signals MCKPWA+ and MCYEND+ in AND-OR-INVERT gates 136, 138 and 140 which generate the stall terms (signals), MCSTL1−, MCSTL2− and MCSTL3−. These other AND functions which generate various stall functions can be classified in two groups: those which are asynchronous with the CPU firmware operation and are of overpowering concern, and those which are controlled by CPU firmware control store bits coming out of control registers. Those coming out of control registers must be prevented from having any effect on the clock until the outputs of those control bits are stable. Therefore, all of those will include as one of their input AND terms the signal MCXOOO−. These are specifically those in the first AND function in gate 136, having input signals REQ-NOW+, CSBUS3+, MCXOOO− and BDNEXT−; the third AND function in gate 136, having input signals MCXOOO−, CSBUS2+ and REQNOW+; the first AND function in gate 138, having input signals STLPUF+, CSBUS3+, MCXOOO− and CSBUS4+; the third AND function in gate 138, having input signals SISTAL+, MCXOOO− and STOFLN−; and all of the AND functions in gate 140 except the second AND function having input signals MCYEND+ and MCYEND+. Signal MCXOOO− is a binary ZERO (low) for the first 35 nanoseconds of each clock cycle period, that is, that the first 35 nanoseconds immediately after the signal MCLOCK+ has gone high (actually in FIG. 3, signal MCLOCK+ goes high 5 nanoseconds after signal MCX000— goes low due to the delay caused by NAND gate 150). Since all control registers are clocked by the rising edge of MCLOCK+, this means that the period when their outputs are doubtful and should not be allowed to affect the clock, these seven AND functions are all turned off by MCX000—.

There are two other AND functions which are of interest. The first of these is the second AND function in gate 136, having input signal POWRUP+. Signal POWRUP+ is essentially a master clear in the CPU. When signal POWRUP+ is high, it stalls the clock. The function of signal POWRUP+ is to clear the clock at master clear time and power up time to a clean, ready-to-start-operating state with no slivers floating around or other noise within the delay lines. Thus when power up finally goes away and the master clear ends, a clean leading edge is established in the clock and from then on the clock functions correctly. However, the clock has to be cleared to a clean state initially which is done by the second AND function of gate 136. The other of these specialized stall terms is the so-called disaster stall which comes in on the second AND function on gate 138, having input signals DSASTF+ and DSA100—. This function is used to delay the next clock cycle whenever a disaster occurs, such as when the CPU attempts to access some data in an input data buffer which was attempted to be loaded from an unavailable resource causing the data in the input buffer to be flagged as in error; this causes the function DSASTF+ to become a binary ONE. The signal DSA100— will go low 100 nanoseconds later, and then high 100 nanoseconds after that. Thus the effect of this second AND function in gate 138 is to temporarily stall the clock, stretching the current clock period by 100 nanoseconds in any firmware step in which a disaster is detected. It stalls the firmware step until 100 nanoseconds after the time when it would normally have ended (from time C, D, E, or F to time G in FIG. 1). At the end of the 100 nanosecond stall, the output of this AND function relaxes and the clock can proceed if no other stall term is in the way.

Of the remaining seven stall terms, the minor ones will be discussed first. The stall function in the fourth AND function of gate 140 is the stall which is used to control the clock by use of a firmware test box. The firmware test box slows down the clock speed to 400 nanoseconds per clock cycle, thus allowing the firmware to run out of slower random access control store memory instead of the faster read only control store memory. The point at which the test box signal enters the clock is the last AND function on gate 140 in the form of signal PLUPTB—. Whenever the firmware test box wishes to stall or delay the next clock pulse it raises signal PLUPTB— high thus generating a MCSTL3— signal of binary ZERO to hold off the clock.

Two other stall functions of interest are those at the third AND function of gate 138 and the third AND function of gate 140. The first of these is for stalling the CPU clock until the separate scientific instruction processor (SIP) which performs floating point arithmetic operations independent of the CPU is not busy. When testing if the SIP has a trap pending, the signal SISTAL+ will be a binary ONE until the SIP goes not busy. If the SIP is not off-line, signal SIOFLN— will be a binary ONE and the clock will stall the CPU. Therefore, whenever a test for an SIP trap is performed, an automatic stall of the CPU clock will occur until the SIP goes not busy.

The third AND function in gate 140 is for stalling until a separate commercial instruction processor (CIP) which performs commercial (editing, etc.) operations independent of the CPU goes not busy. It stalls under the control of the CPU firmware. The signal CISTAL+ controls the stalling of the CPU clock as long as the CIP is not busy, signal CIOFLN— being a binary ONE, if the CIP is installed in the data processing system.

This leaves four other AND functions of gates 136, 138 and 140 to be analyzed. These are concerned with stalling until requests for use of the local bus that connects the CPU with various peripheral device controllers, the CIP, the SIP, and a cache memory are complete. The first of these is the first AND function of gate 140, having input signals CRBUS4+, REQNOW+, CRBUS3+ and MCX000—. This combination of terms is such as to cause the CPU's clock to stall if any local bus request is outstanding (waiting for data to come back from the cache memory). This would include all requests for memory and input/output write cycles because in the preferred embodiment a write cycle can't be performed until the last read cycle has been completed, and also all stalls expressly specified by the CPU firmware. If the firmware commands to stall until the common bus is not busy, then this gate implements the stall.

The other three stall functions found in the first and third AND functions of gate 136 and the first AND function of gate 138 are concerned with stalling the clock if the CPU instruction buffer is partially or completely empty, necessitating an instruction read request, and there is already a local bus request outstanding. Of these three AND functions, the first AND function of gate 136, having input signals REQNOW+, CSBUS3+, MCX000— and BDNEXT— is concerned with stalling if an instruction read request is necessary as a result of taking one word of instruction data out of the buffer. The second of these, the third AND function in gate 136, having input signals MCX000—, CSBUS2+ and REQNOW+, is concerned with stalling if two words are being taken out of the instruction buffer. This is unconditional because taking two words out of the instruction buffer or specifying a data read automatically guarantees that a memory read request is going to be made. Thus the next firmware step cannot be initiated until any current requests outstanding have been completed. Finally, the last AND function, that is the first AND function in gate 138, having input signals STLPUF+, CSBUS3+, MCX000— and CSBUS4+, is concerned with prefetch stalls related to requesting data when the instruction buffer is totally empty as a result of reloading the instruction prefetch counter (for example after executing a branch instruction).

All of these different stall functions are gathered together as signals, MCSTL1—, MCSTL2— and MCSTL3—, and are used as inputs to the NAND gate 130. Any one of these nine AND functions of gates 136, 138 and 140 going to a binary ONE (two of the AND functions, those dealing with MCYEND+ and those dealing with MCKPWA+ are timing paths) will cause the output of the appropriate stall gate to go low and since signal MCXOOO— is the logical end of all 3 of those, then that will cause the MCXOOO— signal to stay high.

While the invention has been shown and described with reference to a preferred embodiment thereof, it will be understood by those skilled in the art that changes in form and detail may be made therein without departing from the spirit and scope of the invention.

What is claimed is:

1. A multifrequency clock system operable to produce a clock signal of a selectable clock cycle period in response to a frequency select signal, said clock signal comprising a fixed width clock pulse in a first state and a dynamically selectable width pulse in a second state, said multifrequency clock system comprising:
   an inverter having an input and an output;
   a first delay line having an input and an output, said input of said first delay line is connected to said output of said inverter;
   a stall logic for stalling said clock system by inhibiting said clock signal from returning to said first state, said stall logic having a plurality of inputs and an output, a first input of said plurality of inputs of said stall logic is connected to said output of said first delay line, said output of said stall logic is connected to said input of said inverter;
   a multitapped second delay line having an input and a plurality of outputs, said input of said multitapped second delay line is connected to said output of said stall logic;
   a frequency selection logic having a plurality of inputs and an output, a first input of said plurality of inputs of said frequency selection logic for receiving said frequency select signal, a remainder of said plurality of inputs of said frequency selection logic connected to said plurality of outputs of said multitapped second delay line, said frequency selection logic for selecting among said plurality of outputs of said multitapped second delay line in response to said frequency select signal;
   a multitapped third delay line having an input and a plurality of outputs, said input of said multitapped third delay line is connected to said output of said frequency selection logic; and
   a first switch assembly having a plurality of inputs and an output, said plurality of inputs of said first switch assembly are connected to said plurality of outputs of said multitapped third delay line, said output of said first switch assembly is connected to a second input of said plurality of inputs of said stall logic whereby selection of one of said plurality of outputs of said multitapped third delay line by said first switch assembly enables adjustment of said selectable clock cycle period by adjusting the width of said dynamically selectable width pulse.

2. The multifrequency clock system as in claim 1 wherein said first delay line is a multitapped first delay line having a plurality of outputs, and wherein said output of said first delay line is not connected directly to said first input of said plurality of inputs of said stall logic but said plurality of outputs of said multitapped first delay line are connected to a plurality of inputs of a second switch assembly, an output of said second switch assembly is connected to said first input to said stall logic whereby selection of one of said plurality of outputs of said multitapped first delay line enables adjustment of said selectable clock cycle period by adjusting the width of said fixed width clock pulse.

3. The multifrequency clock system as in claim 2 wherein said first switch assembly and said second switch assembly are comprised of manually operated switches.

4. The multifrequency clock system as in claim 1 wherein said frequency selection logic includes means for synchronizing said frequency select signal with the beginning of said fixed width clock pulse whereby the duration of said selectable clock cycle period can be selected at the beginning of said selectable clock cycle period.

5. The multifrequency clock system as in claim 1 wherein said stall logic is operative to delay the completion of said dynamically selectable width pulse until a stall signal has returned to a non-stall state.

* * * * *